(12) United States Patent
Hayashi (10) Patent No.: US 11,937,383 B2
(45) Date of Patent: Mar. 19, 2024

(54) DISPLAY DEVICE, ELECTRONIC DEVICE, AND ASSEMBLING METHOD

(71) Applicant: JVCKENWOOD Corporation, Yokohama (JP)

(72) Inventor: Shun Hayashi, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 254 days.

(21) Appl. No.: 17/526,017

(22) Filed: Nov. 15, 2021

(65) Prior Publication Data

US 2022/0078928 A1 Mar. 10, 2022

Related U.S. Application Data

(63) Continuation of application No. PCT/JP2020/024886, filed on Jun. 24, 2020.

(30) Foreign Application Priority Data

Jun. 27, 2019 (JP) .................................. 2019-119757

(51) Int. Cl.
*H05K 5/00* (2006.01)
*B60R 11/02* (2006.01)

(52) U.S. Cl.
CPC ........ *H05K 5/0017* (2013.01); *B60R 11/0229* (2013.01)

(58) Field of Classification Search
CPC .............. H05K 5/0017; B60R 11/0229; H03K 2217/96046; H03K 2217/96079;
(Continued)

(56) References Cited

U.S. PATENT DOCUMENTS 4,146,883 A * 3/1979 Appeldorn ................ G09F 9/33
313/500
10,665,814 B2 * 5/2020 Kwon .................... H10K 71/00
(Continued)

FOREIGN PATENT DOCUMENTS

JP 07-10782 2/1995
JP H09127886 A * 5/1997
(Continued)

OTHER PUBLICATIONS

Translation of WO-2016008903-A1 (Year: 2016).*
(Continued)

*Primary Examiner* — Abhishek M Rathod
(74) *Attorney, Agent, or Firm* — Amin, Turocy & Watson, LLP (57) ABSTRACT

A display device includes a substrate on which at least one light source is disposed; a display plate disposed to face the substrate; a tubular panel that surrounds and holds a periphery of the substrate and a periphery of the display plate; and a lens disposed between the substrate and the display plate and guides light emitted from the at least one light source; wherein the tubular panel has at least one rib protruding from an inner peripheral surface thereof, and the lens has at least one slide groove in which the at least one rib is movable forward and backward when the lens is assembled into the tubular panel and has at least one claw portion disposed adjacent to the at least one slide groove, and the at least one claw portion is positioned between the at least one rib and the display plate in an assembled state.

10 Claims, 9 Drawing Sheets

(58) Field of Classification Search
CPC . H03K 17/962; G09F 13/0427; G09F 13/044; G09F 13/0447; G09F 21/049; G09F 13/04; G09F 9/33; G06F 1/1601
See application file for complete search history.

(56) References Cited

U.S. PATENT DOCUMENTS

| | | | | |
|---|---|---|---|---|
| 10,801,678 | B1* | 10/2020 | McLellan | F21V 19/005 |
| 2006/0146540 | A1* | 7/2006 | Reo | F21V 31/005 |
| | | | | 362/244 |
| 2009/0201433 | A1* | 8/2009 | Hayashi | H04B 1/082 |
| | | | | 348/837 |
| 2009/0303410 | A1* | 12/2009 | Murata | G02B 6/002 |
| | | | | 349/65 |
| 2010/0053882 | A1* | 3/2010 | Hayashi | H04B 1/3822 |
| | | | | 361/679.43 |
| 2016/0309597 | A1* | 10/2016 | Oh | G02F 1/133308 |
| 2019/0327799 | A1* | 10/2019 | Shan | H05B 45/3725 |
| 2019/0364634 | A1* | 11/2019 | Shan | F21V 23/001 |

FOREIGN PATENT DOCUMENTS

| | | | | |
|---|---|---|---|---|
| JP | 2002-072933 | | 3/2002 | |
| JP | 2002072933 A | * | 3/2002 | |
| JP | 3684571 | | 8/2005 | |
| JP | 3684571 B2 | * | 8/2005 | |
| JP | 2009103979 A | * | 5/2009 | |
| JP | 2016-110775 | | 6/2016 | |
| WO | 2016/008903 | | 1/2016 | |
| WO | WO-2016008903 A1 | * | 1/2016 | A47L 15/4293 |

OTHER PUBLICATIONS

Translation of JP-2002072933-A (Year: 2002).*
Translation of JP-3684571-B2 (Year: 2005).*
Translation of JP-H09127886-A (Year: 1997).*
Translation of JP-2009103979-A (Year: 2009).*
International Search Report and Written Opinion for International Application No. PCT/JP2020/024886 dated Aug. 25, 2020, 10 pages.

* cited by examiner

FIG.15

DISPLAY DEVICE, ELECTRONIC DEVICE, AND ASSEMBLING METHOD

CROSS-REFERENCE TO RELATED APPLICATIONS

This application is a Continuation of PCT International Application No. PCT/JP2020/024886 filed on Jun. 24, 2020 which claims the benefit of priority from Japanese Patent Application No. 2019-119757 filed on Jun. 27, 2019, the entire contents of which are incorporated herein by reference.

FIELD

The present invention relates to a display device, an electronic device, and an assembling method.

BACKGROUND

Vehicle switch devices that operate various in-vehicle devices by touch operation are known (see, for example, Japanese Patent Application Laid-open No. 2016-110775 A). The technique described in Japanese Patent Application Laid-open No. 2016-110775 A includes a light source, a display area in which a light emitted from the light source is transmitted and displayed, a touch switch unit, a touch detection unit, and a light source controller that changes a light amount of the emitted light.

In a display device including a switch device having a display area, a light source is disposed on a back surface side of a display plate on which the display area is disposed, and the display area on a front surface is displayed. Therefore, it is desirable to reduce unevenness in brightness of the front surface.

SUMMARY

A display device, an electronic device, and an assembling method are disclosed.

According to one aspect, there is provided an assembling method of a display device comprising a substrate on which at least one light source is disposed; a display plate that is disposed to face the substrate; a tubular panel that surrounds and holds a periphery of the substrate and a periphery of the display plate; and a lens that is disposed between the substrate and the display plate and guides light emitted from the at least one light source; wherein the tubular panel has at least one rib protruding from an inner peripheral surface thereof, and the lens has at least one slide groove in which the at least one rib is movable forward and backward when the lens is assembled into the tubular panel and has at least one claw portion disposed adjacent to the at least one slide groove, the assembling method comprising: sliding the lens in a first direction, in a state where the at least one rib enters the at least one slide groove from a rear side of the tubular panel, and then sliding the lens in a second direction different from the first direction; assembling the display plate into the tubular panel from a front side; and assembling the substrate into a rear portion of the tubular panel into which the display plate and the lens are assembled, in a state where the at least one claw portion is positioned between the at least one rib and the display plate.

According to one aspect, there is provided an assembling method of a display device comprising: a substrate on which at least one light source is disposed; a display plate that is disposed to face the substrate; a tubular panel that surrounds and holds a periphery of the substrate and a periphery of the display plate; and a lens that is disposed between the substrate and the display plate and guides light emitted from the at least one light source; wherein the tubular panel has at least one rib protruding from an inner peripheral surface thereof, and the lens has at least one slide groove in which the at least one rib is movable forward and backward when the lens is assembled into the tubular panel and has at least one claw portion disposed adjacent to the at least one slide groove, the assembling method comprising: sliding the lens in a first direction, in a state where the at least one rib enters the at least one slide groove from a rear side of the tubular panel, and then sliding the lens in a second direction different from the first direction; assembling the display plate into the tubular panel from a front side; and assembling the substrate into a rear portion of the tubular panel into which the display plate and the lens are assembled, in a state where the at least one claw portion is positioned between the at least one rib and the display plate.

The above and other objects, features, advantages and technical and industrial significance of this application will be better understood by reading the following detailed description of presently preferred embodiments of the application, when considered in connection with the accompanying drawings.

DETAILED DESCRIPTION OF THE PREFERRED EMBODIMENTS

Hereinafter, embodiments of a display device, an electronic device, and an assembling method according to the present disclosure will be described in detail with reference to the drawings. Note that the present invention is not limited by the embodiments. In addition, constituent elements in the following embodiments include those that can be replaced and can be easily conceived by those skilled in the art, or those that are substantially the same.

First Embodiment

Electronic Device

Figure 1:
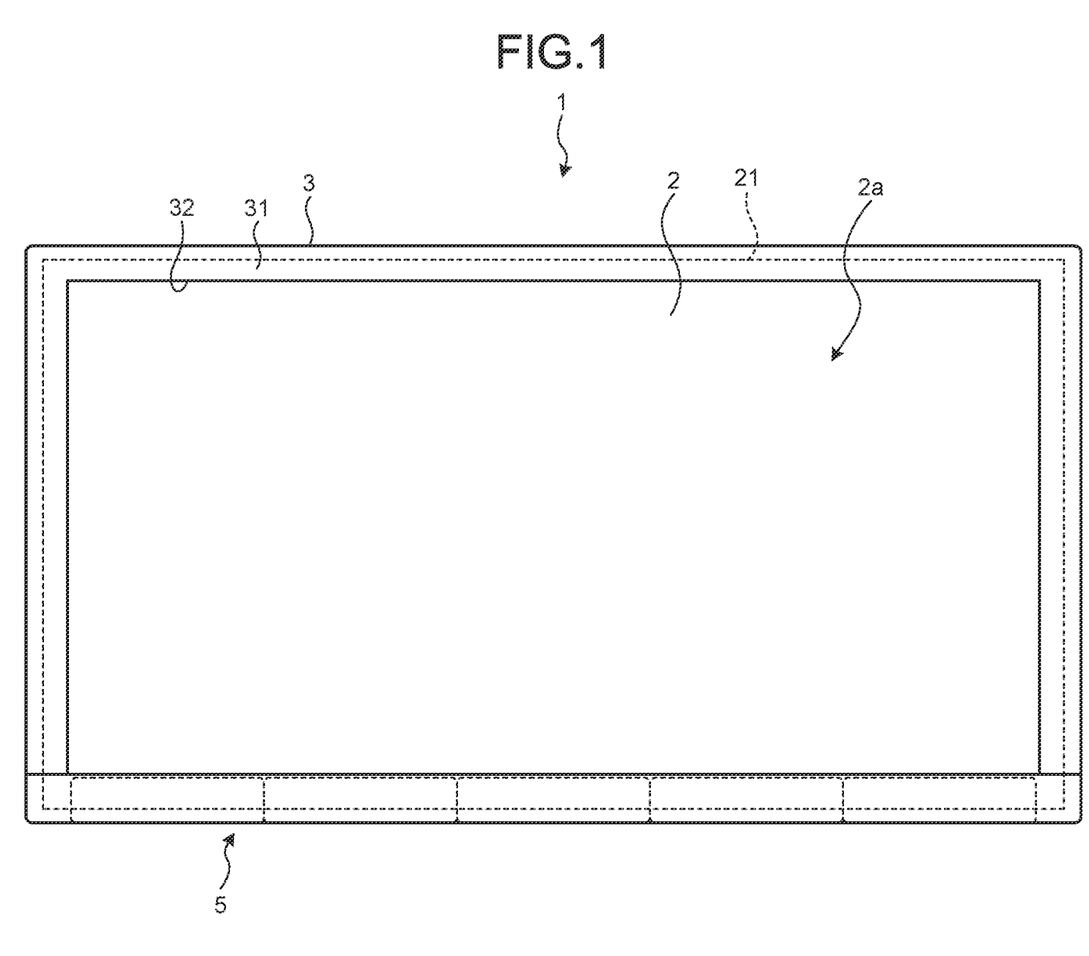
FIG. 1 is a front view illustrating an electronic device according to a first embodiment.

FIG. 1 is a front view illustrating an electronic device 1 according to a first embodiment. As illustrated in FIG. 1, the electronic device 1 according to the present embodiment is, for example, an audio visual (AV) integrated car navigation device mounted inside a vehicle. The electronic device 1 has a display panel 2, a front panel 3, and a display device 5.

Note that in the following description, an upper side of the electronic device 1 in normal use is referred to as an upper side of the electronic device 1, and a lower side of the electronic device 1 in normal use is referred to as a lower side of the electronic device 1. In addition, in the following description, a left-right direction when the electronic device 1 is viewed from a side of the front panel 3 is referred to as a left-right direction of the electronic device 1.

The display panel 2 is formed in a rectangular shape and has a display surface 2a on a front face. The front face is a face visually recognized by an occupant of the vehicle. In the case of a car navigation device, the front face is a face facing a rear in the vehicle. The display surface 2a is formed in a rectangular shape smaller than the rectangular shape of the display panel 2. The display surface 2a is disposed inside an outer edge 21 of the display panel 2. In the present embodiment, in the display panel 2, the display surface 2a is a touch panel.

The front panel 3 is formed in a rectangular shape so as to surround the display panel 2. The front panel 3 has a rectangular frame portion 31 surrounding a periphery of the display panel 2 and a rectangular window portion 32 opening the display surface 2a of the display panel 2 inside the frame portion 31.

Display Device

Figure 2:
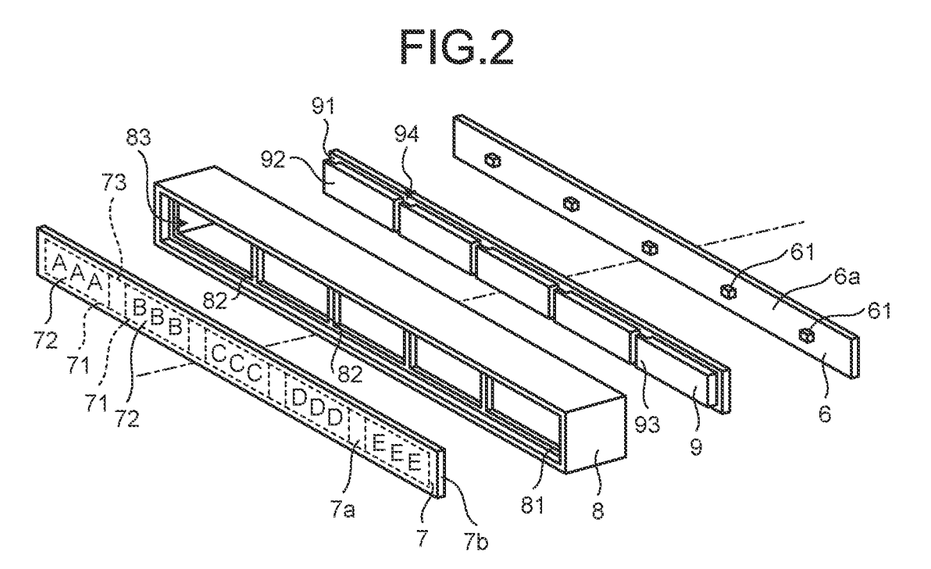
FIG. 2 is an exploded perspective view of a display device according to the first embodiment.
Figure 3:
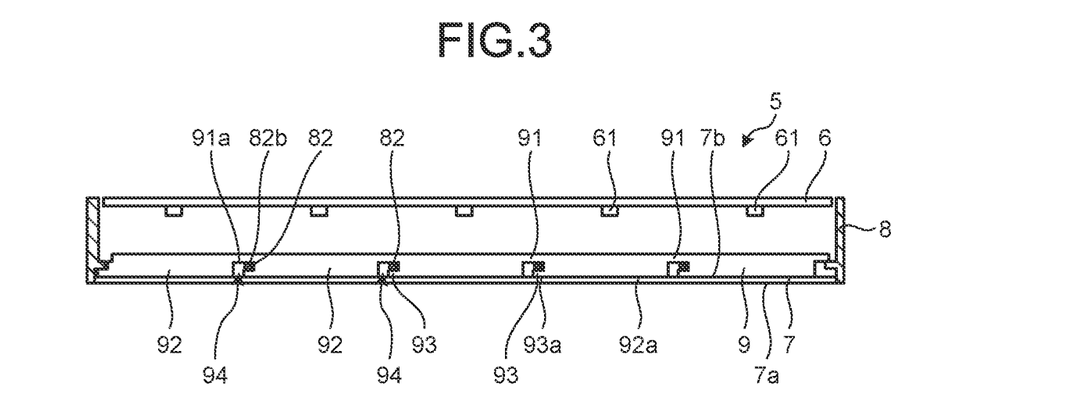
FIG. 3 is a cross-sectional view of the display device according to the first embodiment.

FIG. 2 is an exploded perspective view of the display device 5 according to the first embodiment. FIG. 3 is a cross-sectional view of the display device 5 according to the first embodiment. As illustrated in FIG. 1, the display device 5 is disposed adjacent to a peripheral edge of the front panel 3. In the present embodiment, the display device 5 is disposed on a lower side of the front panel 3. In the present embodiment, the display device 5 has a rectangular shape that is elongated in the left-right direction as viewed in a front-rear direction. The display device 5 has a substrate 6, a display plate 7, a panel 8, and a lens 9.

The substrate 6 is disposed along the display surface 2a of the display panel 2. In the present embodiment, the substrate 6 has a rectangular shape that is elongated in the left-right direction. At least one light source 61 is disposed on a front surface 6a of the substrate 6. The light source 61 emits a light toward a front side. The light source 61 is, for example, a light emitting diode (LED). In the present embodiment, the five light sources 61 are arranged side by side in the left-right direction.

The display plate 7 is disposed along the display surface 2a of the display panel 2. The display plate 7 is disposed on the front side of the substrate 6 and is disposed to face the substrate 6. In the present embodiment, the display plate 7 has a rectangular shape as viewed in the front-rear direction. The display plate 7 is formed in a plate shape and is disposed so as to close the front side of the panel 8 in which the substrate 6, the display plate 7, and the lens 9 are accommodated. The display plate 7 has a dark color such as black or gray, for example.

On a front surface 7a of the display plate 7, a display unit 71 that displays characters, numbers, figures, and symbols such as a logo or a mark visually recognizable by the occupant of the vehicle is disposed. In the present embodiment, five display units 71 are arranged on the display plate 7 side by side in the left-right direction.

Each of the display units 71 has a transmission unit 72 formed on the front surface 7a of the display plate 7. The transmission unit 72 transmits the light emitted from each of the light sources 61. In the transmission unit 72, for example, shapes such as characters, numbers, figures, and symbols in light colors, such as white and a translucent color, capable of transmitting the light are arranged. In the present embodiment, in the transmission unit 72, shapes of characters of "AAA", "BBB", "CCC", "DDD", and "EEE" are arranged in order from the left side.

Panel

Figure 4:
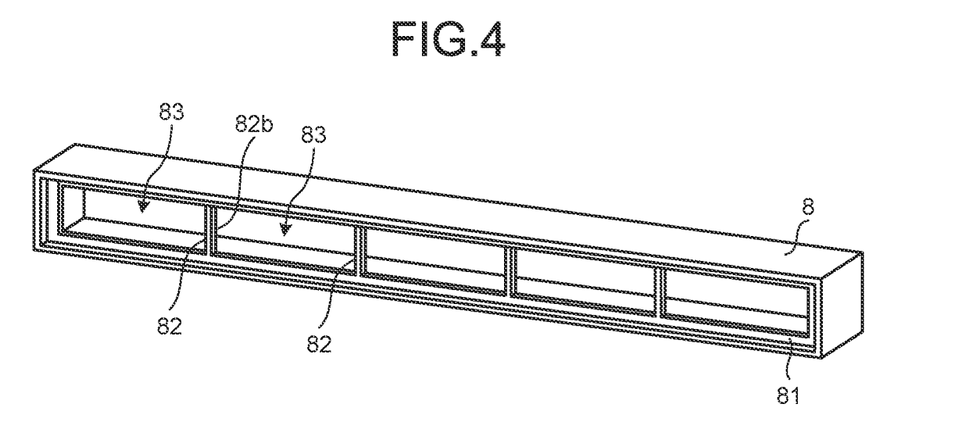
FIG. 4 is a perspective view of a panel illustrated in FIG. 2.

FIG. 4 is a perspective view of the panel 8 illustrated in FIG. 2. As illustrated in FIG. 4, the panel 8 surrounds and holds a periphery of the substrate 6, an outer edge 73 around the display plate 7, and a periphery of the lens 9. The panel 8 is formed in a tubular shape surrounding the periphery of the substrate 6, the outer edge 73 of the display plate 7, and the periphery of the lens 9. In the present embodiment, the panel 8 is formed in a rectangular tube shape.

In the panel 8, a holding portion 81 that holds the outer edge of a base portion 91 of the lens 9 is disposed on an inner peripheral surface. The holding portion 81 protrudes from the inner peripheral surface of the panel 8. The holding portion 81 is formed in a rectangular frame shape having an opening smaller than the outer edge of the base portion 91 of the lens 9. The holding portion 81 positions the lens 9 in the front-rear direction in the panel 8.

The panel 8 has at least one rib 82 protruding from the inner peripheral surface. The rib 82 is formed integrally with the holding portion 81. The panel 8 has the ribs 82 arranged at an interval in the left-right direction. Each of the ribs 82 regulates deflection of the panel 8 due to a heat generation of the display panel 2 or an impact applied from the outside. The rib 82 connects opposing surfaces of the inner peripheral surface of the panel 8 and extends in a vertical direction. The opening of the holding portion 81 is defined by the ribs 82. In the present embodiment, the four ribs 82 are disposed. In the present embodiment, each of the ribs 82 has a square cross section orthogonal to a central axis thereof.

Lens

Figure 5:
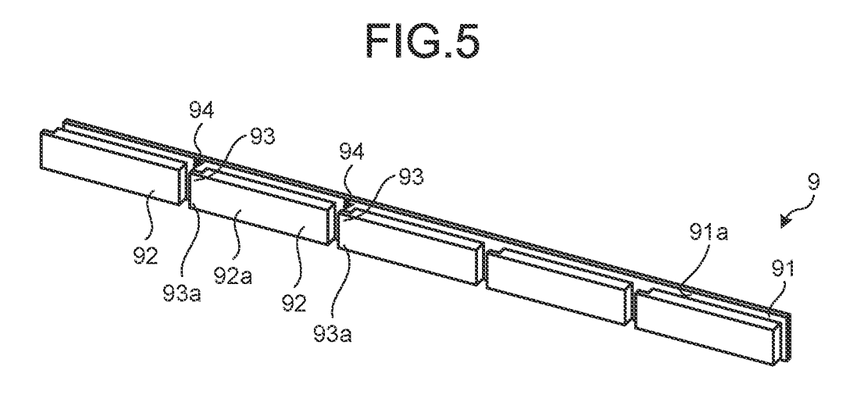
FIG. 5 is a perspective view of a lens illustrated in FIG. 2.
Figure 6:
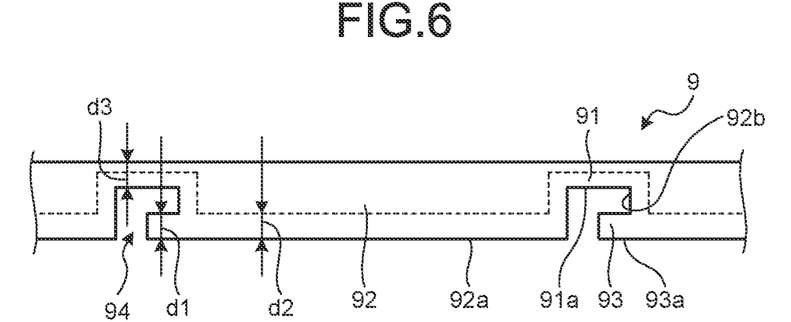
FIG. 6 is a partially enlarged view of the lens.
Figure 7:
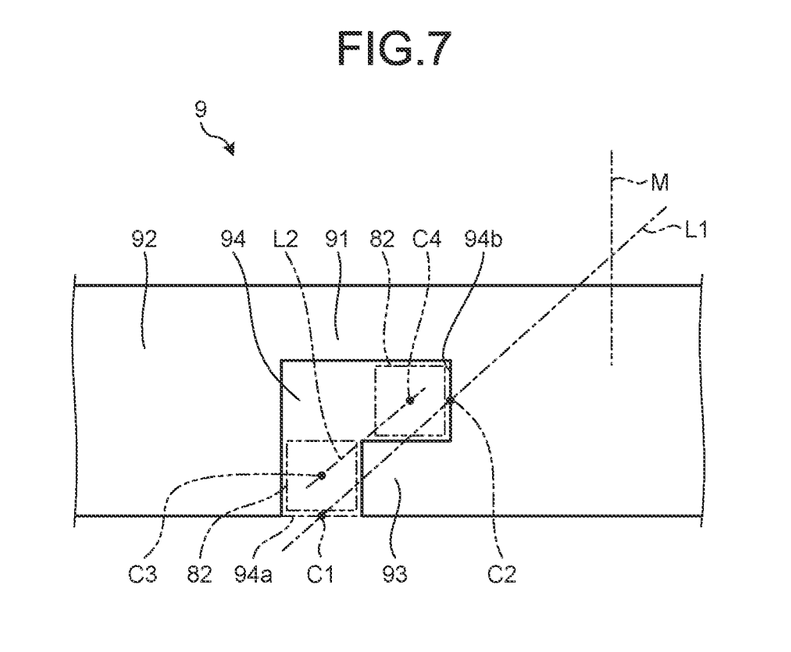
FIG. 7 is a partially enlarged view of a slide groove.

FIG. 5 is a perspective view of the lens 9 illustrated in FIG. 2. FIG. 6 is a partially enlarged view of the lens 9. FIG. 7 is a partially enlarged view of a slide groove 94. As illustrated in FIG. 1, the lens 9 is disposed along the display surface 2a of the display panel 2. As illustrated in FIG. 3, the lens 9 is disposed on the front side of the substrate 6 and on the rear side of the display plate 7. In other words, the lens 9 is disposed so as to be sandwiched between the substrate 6 and the display plate 7. The lens 9 is disposed to face the substrate 6 and the display plate 7. The lens 9 is an optical member that guides the light emitted from the light source 61. The lens 9 is, for example, a light guide lens. The lens 9 is made of a milky white resin material.

More specifically, the lens 9 has the base portion 91, multiple protrusions 92 protruding forward from the base portion 91, and multiple claw portions 93 each protruding leftward from the left side of a front end portion of each of the protrusions 92. In the lens 9, the slide groove 94 is formed between the protrusions 92 that are adjacent to each other. The base portion 91, the protrusions 92, and the claw portion 93 are integrally formed.

The multiple protrusions 92 are connected in the left-right direction by the base portion 91. In the present embodiment, the five protrusions 92 are disposed. As illustrated in FIG. 6, each of the protrusions 92 is recessed on the rear surface side. As illustrated in FIG. 3, in an assembled state, a front surface 92a of the protrusion 92 abuts on a back surface 7b of the display plate 7. In the assembled state, the protrusion 92 is positioned in a window portion 83 surrounded by the holding portion 81 and the rib 82.

The claw portion 93 is disposed adjacent to the slide groove 94. In the assembled state, the claw portion 93 is positioned between the rib 82 and the display plate 7. In the assembled state, the claw portion 93 is positioned on the front side of the rib 82, and a front surface 93a of the claw portion 93 abuts on the back surface 7b of the display plate 7.

In the slide groove 94, the rib 82 is movable forward and backward when the lens 9 is assembled into the panel 8. As illustrated in FIG. 7, in the slide groove 94, a straight line L1 passing through a center C1 of a starting end 94a, which is one end, and a center C2 of a terminal end 94b, which is another end, intersects with an optical axis M of the light source 61. The starting end 94a is an entrance through which the rib 82 enters and exits. The slide groove 94 is bent. In the present embodiment, the slide groove 94 is formed in an L shape as viewed in the vertical direction. In the assembled state, the rib 82 is positioned in the slide groove 94. When the lens 9 is assembled, the lens 9 is slid to the front side, in a state where the rib 82 is positioned in the slide groove 94, and then the lens 9 is slid to the left side, whereby the lens 9 is assembled into the panel 8 from the rear side.

As illustrated in FIG. 7, a center C3 is a center of the rib 82 in a state where the rib 82 is positioned at the starting end 94a of the slide groove 94. The state in which the rib 82 is positioned at the starting end 94a of the slide groove 94 refers to a state in which the entire rib 82 enters the slide groove 94. A center C4 is a center of the rib 82 in a state where the rib 82 is positioned at the terminal end 94b of the slide groove 94. The state in which the rib 82 is positioned at the terminal end 94b of the slide groove 94 refers to a state in which the lens 9 is assembled into the panel 8. A straight line L2 passing through the center C3 and the center C4 intersects with the optical axis M of the light source 61.

A thickness of each portion of the lens 9 will be described with reference to FIG. 6. A thickness d1 is a thickness of the claw portion 93. The thickness d1 of the claw portion 93 is set to such a thickness that the claw portion 93 can guide the light emitted from the light source 61 to set the display plate 7 abutting on the claw portion 93 to a predetermined brightness. A thickness d2 of the protrusion 92 and a thickness d3 of the base portion 91 are preferably the same as the thickness d1 of the claw portion 93 so that unevenness in brightness of the front surface 7a of the display plate 7 is reduced and the brightness becomes uniform. The lens 9 preferably has a uniform thickness.

Assembling Method of Electronic Device

Figure 8:
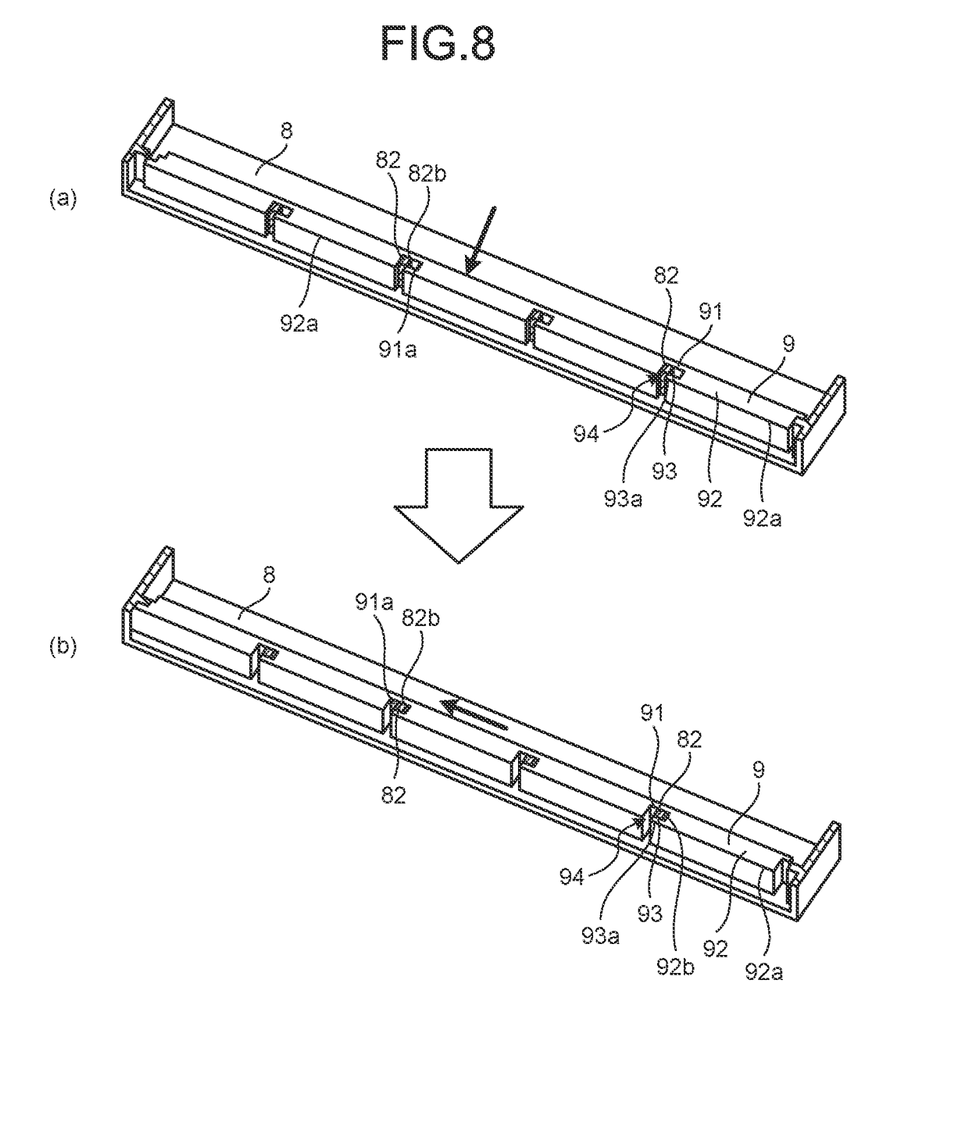
FIG. 8 is a perspective view illustrating an assembling procedure of the display device according to the first embodiment.

Next, an assembling method and operation of the electronic device 1 will be described with reference to FIG. 8. FIG. 8 is a perspective view illustrating an assembling procedure of the display device 5 according to the first embodiment.

As illustrated in an upper of FIG. 8, the lens 9 is assembled from the rear side of the panel 8. In a state where the rib 82 of the panel 8 enters the slide groove 94 of the lens 9, the lens 9 is slid forward, which is a first direction, indicated by the arrow. A rear surface 82b of the rib 82 abuts on a front surface 91a of the base portion 91. The protrusion 92 is positioned in the window portion 83 surrounded by the holding portion 81 and the rib 82.

As illustrated in an lower of FIG. 8, in a state where the rear surface 82b of the rib 82 abuts on the front surface 91a of the base portion 91, the lens 9 is slid to a lateral side, which is a second direction, indicated by the arrow until the rib 82 abuts on a peripheral surface 92b of the protrusion 92 that defines the terminal end 94b of the slide groove 94. In this way, the lens 9 is assembled into the panel 8.

Next, the display plate 7 is assembled, from the front side, into the panel 8 into which the lens 9 is assembled. In a state where the display plate 7 is assembled into the panel 8, the front surface 92a of the protrusion 92 and the front surface 93a of the claw portion 93 abut on the back surface 7b of the display plate 7.

Next, the substrate 6 is assembled into the rear portion of the panel 8 into which the display plate 7 and the lens 9 are assembled. In this way, the assembled display device 5 is assembled on a lower side of the electronic device 1.

Operation of Electronic Device

In the display device 5 disposed on the lower side of the electronic device 1, after the electronic device 1 is activated during activation of the vehicle, the light source 61 disposed on the substrate 6 emits the light forward. The light emitted from the light source 61 enters the lens 9 from the rear side. The light incident on the lens 9 is guided by the lens 9 and emitted from the peripheral surface of the lens 9 to the outside. The light emitted from the front surface 91a of the base portion 91 of the lens 9, the front surface 92a of the protrusion 92, and the front surface 93a of the claw portion 93 is incident on the display plate 7 from the back surface 7b. On the front surface 7a of the display plate 7, portions abutting on the front surface 92a of the protrusion 92 and the front surface 93a of the claw portion 93 are brightened by the light emitted from the front surface 92a of the protrusion 92 and the front surface 93a of the claw portion 93. In addition, on the front surface 7a of the display plate 7, a portion facing the starting end 94a of the slide groove 94 is brightened by the light emitted from the front surface 91a of the base portion 91 and passing through the slide groove 94. The claw portion 93 guides the light incident on the lens 9 to brighten the display plate 7 positioned on the front side of the rib 82. The claw portion 93 compensates for the light, which would have been blocked by the rib 82 if there had been no claw portion 93, and reduces unevenness in brightness of the display plate 7. In this way, the unevenness in brightness is reduced on the front surface 7a of the display plate 7. The transmission unit 72 of the display plate 7 transmits the light into shapes such as characters, numbers, figures, and symbols. As a result, shapes such as characters, numbers, figures, and symbols are displayed brightly on the transmission unit 72 of the display plate 7.

Effects

As described above, in the present embodiment, the display device 5 disposed on the lower side of the electronic device 1 includes the substrate 6, the display plate 7, the lens 9, and the panel 8 that surrounds and holds the substrate 6, the display plate 7, and the lens 9. In addition, in the present embodiment, the lens 9 is provided with the slide groove 94 in which the rib 82 protruding from the inner peripheral surface of the panel 8 is movable forward and backward. Moreover, in the present embodiment, the claw portion 93 disposed adjacent to the slide groove 94 is positioned between the rib 82 and the display plate 7 in the assembled state. As a result, according to the present embodiment, on the front surface 7a of the display plate 7, the portions abutting on the front surface 92a of the protrusion 92 and the front surface 93a of the claw portion 93 can be brightened by the light emitted from the lens 9. Moreover, according to the present embodiment, on the front surface 7a of the display plate 7, the portion facing the starting end 94a of the slide groove 94 can be brightened by the light emitted from the front surface 91a of the base portion 91 and passing through the slide groove 94. Furthermore, according to the present embodiment, the claw portion 93 can guide the light incident on the lens 9 to brighten the display plate 7 positioned on the front side of the rib 82. In the present embodiment, the light blocked by the rib 82 can be compensated by the claw portion 93, and the unevenness in brightness of the display plate 7 can be reduced. In the present embodiment, it is possible to eliminate a portion where the light emitted from the lens 9 is blocked by the rib 82 on the front surface 7a of the display plate 7. In this way, according to the present embodiment, it is possible to reduce the unevenness in brightness and make the brightness uniform on the front surface 7a of the display plate 7. In the present embodiment, the transmission unit 72 of the display plate 7 transmits the light to shapes of characters, numbers, figures, symbols, and the like arranged and can brightly display the shapes of the characters, numbers, figures, symbols, and the like without the unevenness.

Figure 14:
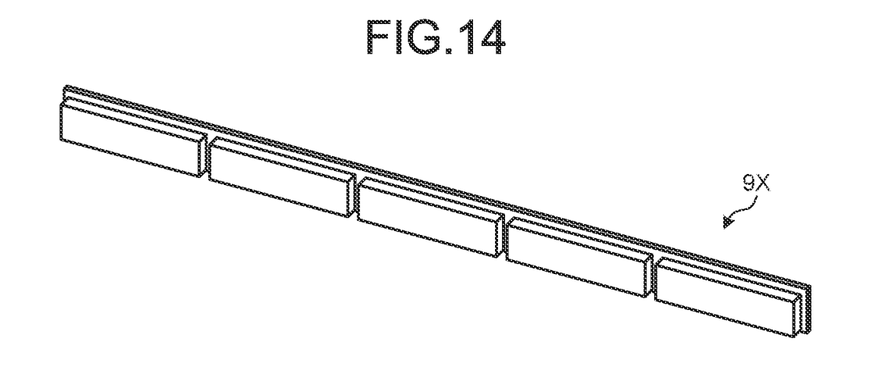
FIG. 14 is a perspective view of a conventional lens.
Figure 15:
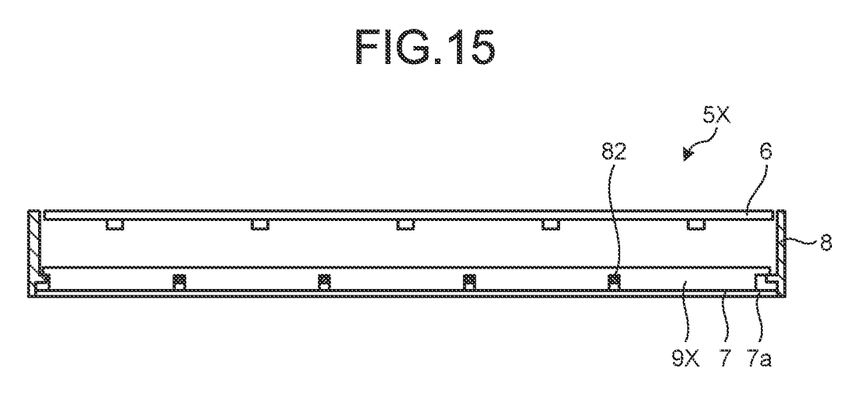
FIG. 15 is a cross-sectional view of a conventional display device.

Here, a conventional display device 5X will be described for comparison with reference to FIGS. 14 and 15. FIG. 14 is a perspective view of a conventional lens 9X. FIG. 15 is a cross-sectional view of a conventional display device 5X. The conventional display device 5X is different from the display device 5 in that the lens 9X does not have a claw portion. In the display device 5X, since the claw portion is not disposed on the front side of the rib 82, the brightness of the display plate 7 positioned on the front side of the rib 82 is reduced as compared with the surroundings. In the display device 5X, on the front surface 7a of the display plate 7, a portion where the light emitted from the lens 9 is blocked by the rib 82 becomes darker than the surroundings.

Modification of First Embodiment

Figure 9:
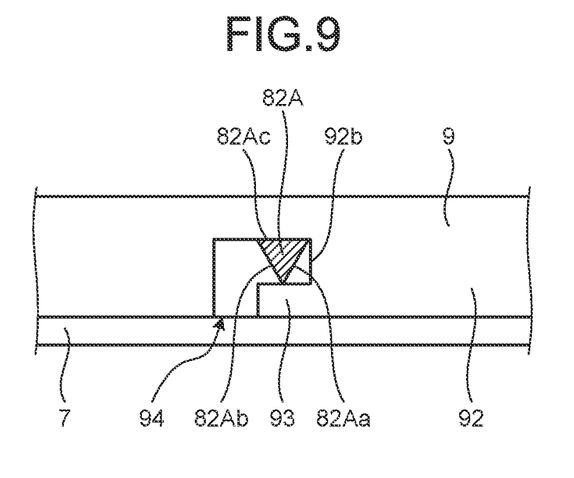
FIG. 9 is a partially enlarged view of another example of the display device according to the first embodiment.
Figure 10:
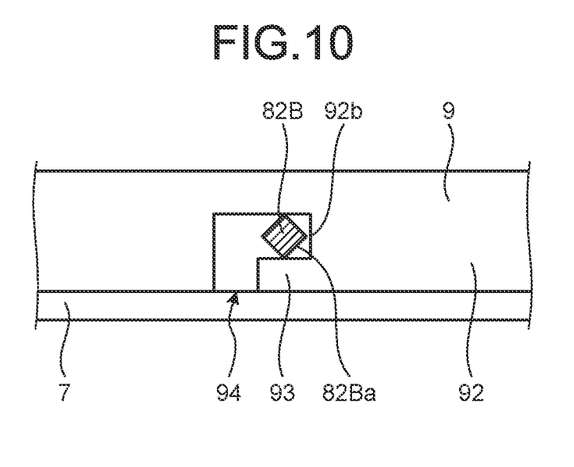
FIG. 10 is a partially enlarged view of another example of the display device according to the first embodiment.
Figure 11:
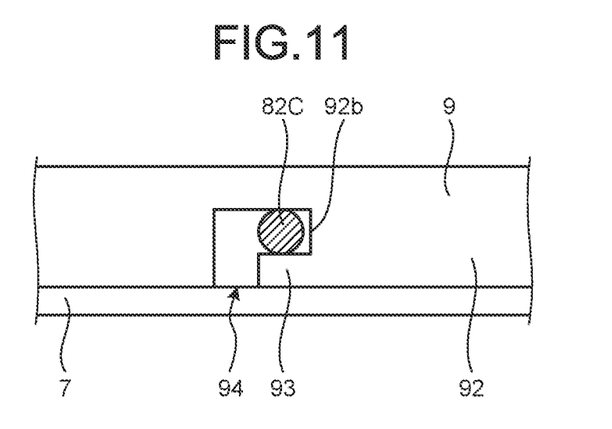
FIG. 11 is a partially enlarged view of another example of the display device according to the first embodiment.

FIG. 9 is a partially enlarged view of another example of the display device 5 according to the first embodiment. FIG. 10 is a partially enlarged view of another example of the display device 5 according to the first embodiment. FIG. 11 is a partially enlarged view of another example of the display device 5 according to the first embodiment. In the following description, the same constituent elements as those of the display device 5 are denoted by the same reference numerals or corresponding reference numerals, and a detailed description thereof will be omitted.

As illustrated in FIG. 9, a rib 82A has a cross section including a surface inclined with respect to an optical axis of a center ray of the light source 61. The rib 82A orthogonal to a central axis has a triangular cross section. A peripheral surface 82Aa and a peripheral surface 82Ab of the rib 82A are disposed so as to intersect with the optical axis of the light source 61. A peripheral surface 82Ac of the rib 82A is disposed along the display surface 2a of display panel 2. As a result, an area where the rib 82A and the claw portion 93 face each other is reduced. A space is formed between the peripheral surface 82Aa of the rib 82A and the peripheral surface 92b of the protrusion 92. As a result, it is possible to prevent the light emitted from the lens 9 toward the display plate 7 from being blocked by the rib 82A.

As illustrated in FIG. 10, a rib 82B has a rectangular cross section. The rib 82B orthogonal to a central axis has a rhombic cross section orthogonal to a central axis. All peripheral surfaces of the rib 82B are disposed so as to intersect with the optical axis of the light source 61. As a result, an area where the rib 82B and the claw portion 93 face each other is reduced. A space is formed between a peripheral surface 82Ba of the rib 82B and the peripheral surface 92b of the protrusion 92. As a result, it is possible to suppress the light emitted from the lens 9 toward the display plate 7 from being blocked by the rib 82B.

As illustrated in FIG. 11, at least a part of the peripheral surface of a rib 82C has an arc-shaped cross section. The rib 82C orthogonal to a central axis has a circular cross section. A space is formed between a peripheral surface of the rib 82C and the peripheral surface 92b of the protrusion 92. As a result, it is possible to suppress the light emitted from the lens 9 toward the display plate 7 from being blocked by the rib 82C.

Second Embodiment

Figure 12:
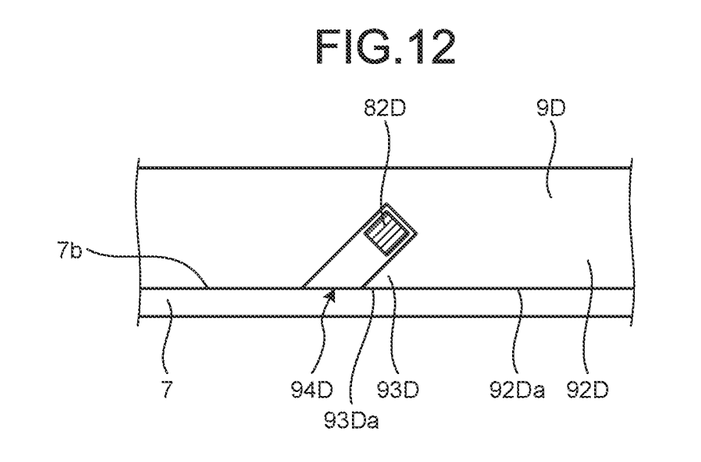
FIG. 12 is a partially enlarged view of a display device according to a second embodiment.

A display device 5 according to the present embodiment will be described with reference to FIG. 12. FIG. 12 is a partially enlarged view of the display device 5 according to the second embodiment. The present embodiment is different from the first embodiment in a rib 82D and a slide groove 94D of a lens 9D. The rib 82D is formed in the same manner as the rib 82B illustrated in FIG. 10.

The slide groove 94D is formed along a direction intersecting with the optical axis of the light source 61. The slide groove 94D extends obliquely from the left side, from the front side to the rear side, as viewed in the vertical direction. A claw portion 93D is disposed adjacent to the slide groove 94D.

When the lens 9D is assembled, the lens 9D is slid obliquely forward, in a state where the rib 82D enters the slide groove 94D of the lens 9D, until a front surface 92Da of a protrusion 92D and a front surface 93Da of the claw portion 93D abut on the back surface 7b of the display plate 7.

As described above, in the present embodiment, the slide groove 94D is formed along the direction intersecting with the optical axis of the light source 61. According to the present embodiment, since the slide groove 94D does not have a bent portion, the lens 9D can be smoothly assembled.

Third Embodiment

Figure 13:
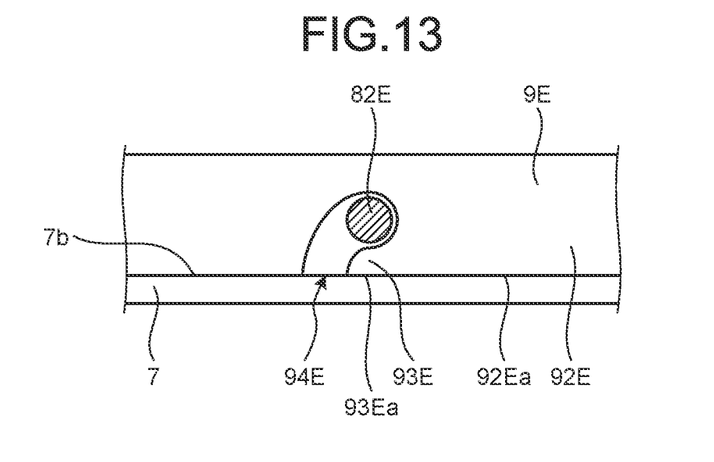
FIG. 13 is a partially enlarged view of a display device according to a third embodiment.

A display device 5 according to the present embodiment will be described with reference to FIG. 13. FIG. 13 is a partially enlarged view of the display device 5 according to a third embodiment. The present embodiment is different from the first embodiment in a rib 82E and a slide groove 94E of a lens 9E. The rib 82E is formed in the same manner as the rib 82C illustrated in FIG. 11.

The slide groove 94E is curved. A claw portion 93E is disposed adjacent to the slide groove 94E.

When the lens 9E is assembled, the lens 9E is slid obliquely forward, in a state where the rib 82E enters the slide groove 94E, until a front surface 92Ea of a protrusion 92E and a front surface 93Ea of the claw portion 93E abut on the back surface 7b of the display plate 7.

As described above, in the present embodiment, the slide groove 94E is formed in a curved shape. According to the present embodiment, since the slide groove 94E does not have a bent portion, the lens 9E can be smoothly assembled.

The above-described constituent elements include those that can be easily assumed by those skilled in the art and those that are substantially the same. Moreover, the above-described configurations can be appropriately combined. In addition, various omissions, replacements, or changes in the configuration can be made without departing from the gist of the present invention.

Although the display device has been described above, the present invention is not limited thereto. For example, the display device may be a display device that has a function as a switch and brightly displays characters, numbers, figures, symbols, and the like.

The display device, the electronic device, and the assembling method of the present disclosure can be used for, for example, an AV integrated car navigation device.

A display device, an electronic device, and an assembling method according to the present disclosure obtain an effect of reducing unevenness in brightness of a front surface.

Although the application has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A display device comprising:
    a substrate on which light sources are disposed;
    a display plate that is disposed to face the substrate;
    a tubular panel that surrounds and holds a periphery of the substrate and a periphery of the display plate; and
    a lens that is disposed between the substrate and the display plate and guides light emitted from the light sources; wherein
    the tubular panel has at least one rib which is arranged between the light sources and protrudes from an inner peripheral surface thereof,
    the lens has at least one slide groove in which the at least one rib is movable forward and backward when the lens is assembled into the tubular panel and has at least one claw portion disposed adjacent to the at least one slide groove, and
    the at least one claw portion is positioned between the at least one rib and the display plate in an assembled state.

2. The display device according to claim 1, wherein in the at least one slide groove, a straight line passing through a center of one end thereof and a center of another end thereof intersects with an optical axis of a light source of the light sources.

3. The display device according to claim 2, wherein the at least one slide groove is bent.

4. The display device according to claim 2, wherein the at least one slide groove is formed along a direction intersecting with an optical axis of a light source of the light sources.

5. The display device according to claim 2, wherein the at least one slide groove is curved.

6. The display device according to claim 1, wherein the at least one rib has a rectangular cross section.

7. The display device according to claim 1, wherein the at least one rib has a cross section including at least one surface inclined with respect to an optical axis of a center ray of a light source of the light sources.

8. The display device according to claim 1, wherein at least a part of a peripheral surface of the at least one rib has an arc-shaped cross section.

9. An electronic device comprising:
    a display panel having a display surface on a front surface;
    a front panel surrounding a periphery of the display panel; and
    the display device according to claim 1 adjacent to the front panel.

10. An assembling method of a display device comprising:
    a substrate on which light sources are disposed;
    a display plate that is disposed to face the substrate;
    a tubular panel that surrounds and holds a periphery of the substrate and a periphery of the display plate; and
    a lens that is disposed between the substrate and the display plate and guides light emitted from the light sources; wherein
    the tubular panel has at least one rib which is arranged between the light sources and protrudes from an inner peripheral surface thereof, and
    the lens has at least one slide groove in which the at least one rib is movable forward and backward when the lens is assembled into the tubular panel and has at least one claw portion disposed adjacent to the at least one slide groove, the assembling method comprising:
    sliding the lens in a first direction, in a state where the at least one rib enters the at least one slide groove from a rear side of the tubular panel, and then sliding the lens in a second direction different from the first direction;
    assembling the display plate into the tubular panel from a front side; and
    assembling the substrate into a rear portion of the tubular panel into which the display plate and the lens are assembled, in a state where the at least one claw portion is positioned between the at least one rib and the display plate.

* * * * *